US009930282B2

(12) United States Patent
Lee (10) Patent No.: US 9,930,282 B2
(45) Date of Patent: Mar. 27, 2018

(54) COUNTING APPARATUS, ANALOG-TO-DIGITAL CONVERTER AND IMAGE SENSOR INCLUDING THE SAME

(71) Applicant: SK hynix Inc., Gyeonggi-do (KR)

(72) Inventor: Don-Ku Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 17 days.

(21) Appl. No.: 15/181,146

(22) Filed: Jun. 13, 2016

(65) Prior Publication Data
US 2017/0155859 A1 Jun. 1, 2017

(30) Foreign Application Priority Data
Nov. 27, 2015 (KR) .................. 10-2015-0167655

(51) Int. Cl.
| H04N 5/378 | (2011.01) |
| H04N 5/357 | (2011.01) |
| H04N 5/3745 | (2011.01) |
| H03M 1/12 | (2006.01) |

(52) U.S. Cl.
CPC ............ *H04N 5/378* (2013.01); *H03M 1/123* (2013.01); *H04N 5/3575* (2013.01); *H04N 5/37452* (2013.01); *H04N 5/37455* (2013.01)

(58) Field of Classification Search
CPC ........ H04N 5/378; H04N 5/155; H04N 5/335; H04N 5/3575; H04N 5/37455; H04N 5/37457; H04N 5/35527; H04N 5/374; H04N 5/3742; H04N 5/37452; H03M 1/121–1/123; H03M 1/56; H01L 27/14609; H01L 27/14643
See application file for complete search history.

(56) References Cited

U.S. PATENT DOCUMENTS

| 6,822,211 | B2 * | 11/2004 | Hagihara | .......... H01L 27/14609 |
| | | | | 250/208.1 |
| 8,072,519 | B2 * | 12/2011 | Noda | ................... H04N 5/3452 |
| | | | | 348/294 |
| 8,890,990 | B2 * | 11/2014 | Hisamatsu | ........... H03K 23/548 |
| | | | | 348/294 |
| 8,976,278 | B2 * | 3/2015 | Yao | ........................ H04N 5/378 |
| | | | | 348/295 |
| 9,264,634 | B2 * | 2/2016 | Oike | ..................... H03M 1/186 |
| 9,313,425 | B2 * | 4/2016 | Hagihara | ............. H04N 5/3355 |
| 9,479,178 | B2 * | 10/2016 | Choi | ....................... H03K 23/40 |
| 9,530,341 | B2 * | 12/2016 | Cheng | ..................... H01L 27/12 |
| 2001/0026321 | A1 * | 10/2001 | Goto | ...................... H04N 5/347 |
| | | | | 348/302 |

(Continued)

FOREIGN PATENT DOCUMENTS

| KR | 1020090084456 | 8/2009 |
| KR | 1020120053556 | 5/2012 |

*Primary Examiner* — Michael Osinski
(74) *Attorney, Agent, or Firm* — IP & T Group LLP (57) ABSTRACT

A counting apparatus may include: a count control unit suitable for controlling a counting operation of a common value and a differential value of two pixel signals according to two neighboring output signals of a comparator unit; a counting unit suitable for counting a clock during a period corresponding to the common value and the differential value, according to control of the count control unit; and a memory unit suitable for storing count information from the counting unit and operation information from the count control unit.

8 Claims, 8 Drawing Sheets

(56) References Cited

U.S. PATENT DOCUMENTS

| | | | | |
|---|---|---|---|---|
| 2006/0012698 A1* | 1/2006 | Nitta | ................ | H04N 3/155 |
| | | | | 348/308 |
| 2006/0013485 A1* | 1/2006 | Nitta | ................ | G06K 9/60 |
| | | | | 382/194 |
| 2008/0284626 A1* | 11/2008 | Hattori | ................ | H03M 1/129 |
| | | | | 341/133 |
| 2010/0238310 A1* | 9/2010 | Shizukuishi | ...... | H01L 27/14643 |
| | | | | 348/220.1 |
| 2013/0208157 A1* | 8/2013 | Bechtel | ................ | H04N 5/3559 |
| | | | | 348/297 |
| 2014/0036114 A1* | 2/2014 | Yoneda | ................ | H04N 5/361 |
| | | | | 348/247 |
| 2014/0063294 A1* | 3/2014 | Tatsuzawa | ............ | H04N 5/265 |
| | | | | 348/239 |
| 2015/0002655 A1* | 1/2015 | Zheng | ................ | G01N 21/9501 |
| | | | | 348/87 |
| 2015/0256770 A1* | 9/2015 | Seta | ................ | H04N 5/3535 |
| | | | | 250/208.1 |
| 2017/0070691 A1* | 3/2017 | Nishikido | .......... | H04N 5/35581 |
| 2017/0339359 A1* | 11/2017 | Kim | ................ | H04N 5/378 |

* cited by examiner

COUNTING APPARATUS, ANALOG-TO-DIGITAL CONVERTER AND IMAGE SENSOR INCLUDING THE SAME

CROSS-REFERENCE TO RELATED APPLICATIONS

The present application claims priority under 35 U.S.C. § 119(a) to Korean Patent Application No. 10-2015-0167655, filed on Nov. 27, 2015, which is incorporated herein by reference in its entirety.

BACKGROUND

1. Field

Various embodiments of the present invention relate to an image sensor and, more particularly, a counting apparatus, an analog-to-digital converter and a complementary metal oxide semiconductor (CMOS) image sensor including the same.

2. Description of the Related Art

An analog-to-digital converter (ADC) of a CMOS image sensor is generally implemented by a column parallel ADC since it is much smaller compared with a conventional ADC. The column parallel ADC includes a digital-to-analog converter (i.e. a ramp signal generator), a plurality of comparators, a plurality of n-bit counters each being coupled to a respective comparator, and a plurality of n-bit memories each being coupled to a respective counter.

Each of the comparators compares a pixel signal (i.e. a pixel voltage) from a pixel connected thereto with a ramp signal that is output by the ramp signal generator and works as a reference voltage to control an operation of a corresponding counter. Thus, the counter is controlled according to an output signal of the comparator and counts a clock signal input thereto. The memory stores and maintains digital data of the pixel signal obtained by the operation of the ADC, so that the counter continues to operate while the digital data is being read out.

In such an operation process, each comparator and each counter operates independently from other comparators and counters. Accordingly, the power consumption in each counter increases with the number of counts. Thus, if the number of counts could be decreased, the power consumption in the counters would be reduced as well.

SUMMARY

Various embodiments are directed to a counting apparatus which consumes less electric power, and an analog-to-digital converter and an image sensor including the same.

In accordance with an embodiment of the present invention, a counting apparatus may include: a count control unit suitable for controlling a counting operation of a common value and a differential value of two pixel signals according to two neighboring output signals of a comparator unit; a counting unit suitable for counting a clock during a period corresponding to the common value and the differential value, according to control of the count control unit; and a memory unit suitable for storing count information from the counting unit and operation information from the count control unit.

In accordance with an embodiment of the present invention, an analog-to-digital converter may include: a correlated double sampling unit suitable for performing a correlated double sampling with respect to each of pixel signals output by a pixel array to output correlated double sampling pixel signals; a comparator unit suitable for comparing each of the correlated double sampling pixel signals with a ramp signal; a count control unit suitable for controlling counting operation of a common value and a differential value of two pixel signals according to two neighboring correlated double sampling pixel signals; a counting unit suitable for counting a clock during a period corresponding to the common value and the differential value, according to control of the count control unit; and a memory unit suitable for storing count information from the counting unit and operation information from the count control unit.

In accordance with an embodiment of the present invention, an image sensor may include: a pixel array suitable for generating a pixel signal corresponding to incident light; a row decoder suitable for selecting and controlling pixels in the pixel array by a row line; a ramp signal generator suitable for generating a ramp signal; a correlated double sampling unit suitable for performing a correlated double sampling with respect to each of the pixel signals output by the pixel array to output correlated double sampling pixel signals; a comparator unit suitable for comparing each of the correlated double sampling pixel signals with the ramp signal; a count control unit suitable for controlling counting operation of a common value and a differential value of two pixel signals according to two neighboring correlated double sampling pixel signals; a counting unit suitable for counting a clock during a period corresponding to the common value and the differential value, according to control of the count control unit; a memory unit suitable for storing count information from the counting unit and operation information from the count control unit; a column readout circuit suitable for outputting data stored in the memory unit; a controller suitable for controlling operations of the counting unit, the memory unit, and the column readout circuit; and an arithmetic unit suitable for performing an arithmetic operation on the count information from the column readout circuit according to the operation information to output pixel data.

In accordance with another embodiment of the present invention, a counting apparatus may include: a count control unit suitable for controlling counting operation of a common value and a differential value of two pixel signals according to two neighboring correlated double sampling pixel signals corresponding to two neighboring columns of a same color; a counting unit suitable for counting a clock during a period corresponding to the common value and the differential value, according to control of the count control unit; and a memory unit suitable for storing count information from the counting unit and operation information from the count control unit.

In accordance with another embodiment of the present invention, an analog-to-digital converter may include: a correlated double sampling unit suitable for performing a correlated double sampling with respect to each of pixel signals output by a pixel array to output correlated double sampling pixel signals; a comparator unit suitable for comparing each of the correlated double sampling pixel signals with a ramp signal; a count control unit suitable for controlling counting operation of a common value and a differential value of two pixel signals according to two neighboring correlated double sampling pixel signals corresponding to two neighboring columns of a same color; a counting unit suitable for counting a clock during a period corresponding to respective one of the common value and the differential value, according to control of the count control unit; and a memory unit suitable for storing count information from the counting unit and operation information from the count control unit.

In accordance with another embodiment of the present invention, an image sensor may include: a pixel array suitable for suitable for generating a pixel signal corresponding to incident light; a row decoder suitable for selecting and controlling pixels in the pixel array by a row line; a ramp signal generator suitable for generating a ramp signal; a correlated double sampling unit suitable for performing a correlated double sampling with respect to each of the pixel signals output by the pixel array to output correlated double sampling pixel signals; a comparator unit suitable for comparing each of the correlated double sampling pixel signals with the ramp signal; a count control unit suitable for controlling counting operation of a common value and a differential value of two pixel signals according to two neighboring correlated double sampling pixel signals corresponding to two neighboring columns of a same color; a counting unit suitable for counting a clock during a period corresponding to the common value and the differential value, according to control of the count control unit; a memory unit suitable for storing count information from the counting unit and operation information from the count control unit; a column readout circuit suitable for outputting data stored in the memory unit; a controller suitable for controlling operations of the counting unit, the memory unit, and the column readout circuit; and an arithmetic unit suitable for performing an arithmetic operation on to the count information from the column readout circuit according to the operation information to output pixel data.

The embodiments of the present invention reduce the number of counts in the counter, and in turn may reduce the electric power consumption in the counter.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments. For example, in the drawings, the thicknesses and the intervals of elements may be exaggerated compared to an actual physical thickness for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Figure 1:
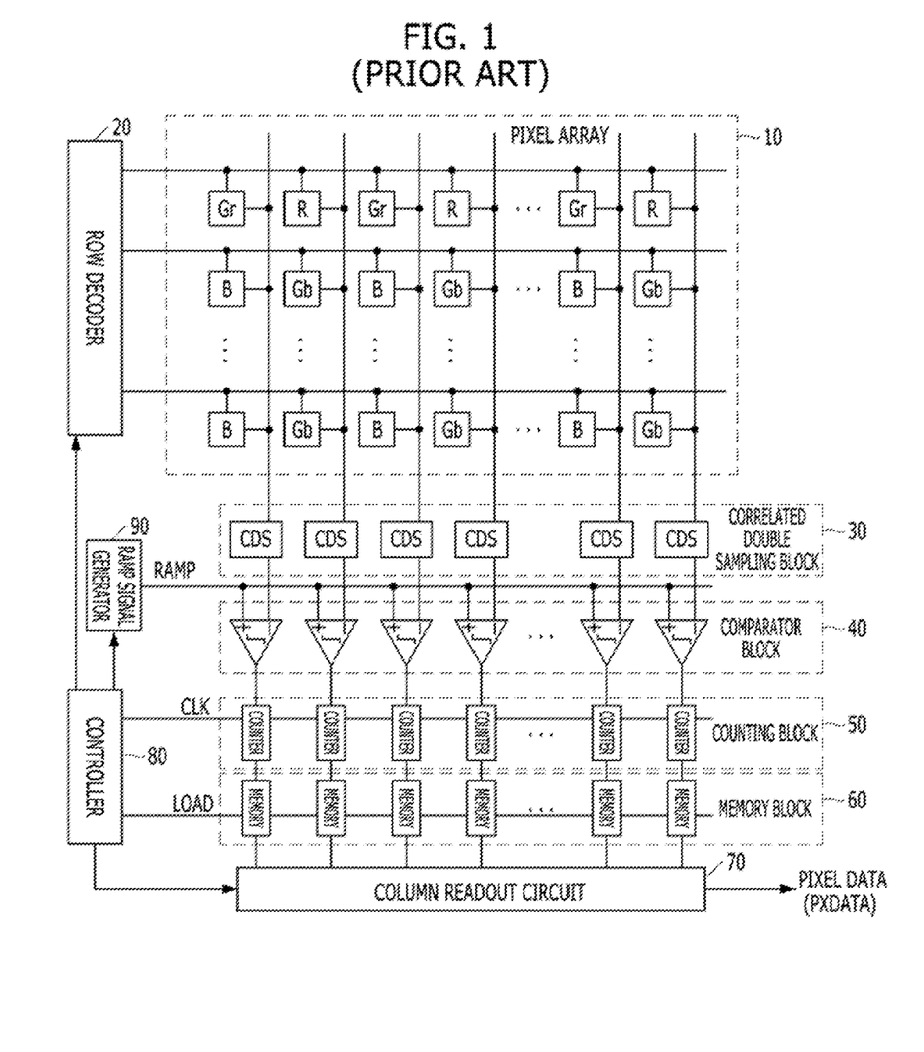
FIG. 1 is a block diagram of a typical CMOS image sensor.

FIG. 1 is a block diagram of a typical CMOS image sensor having a column parallel structure. The CMOS image sensor shown in FIG. 1 includes a pixel array 10, a row decoder 20, a correlated double sampling block 30, a comparator block 40, a counting block 50, a memory block 60, a column readout circuit 70, a controller 80, and a ramp signal generator 90.

The pixel array 10 generates and outputs pixel signals corresponding to incident light. The row decoder 20 selects pixels in the pixel array 10 by a row line under the control of the controller 80 including a timing generator, so as to allow controlling the operation of the pixels in the selected row line. The ramp signal generator 90 generates a ramp signal RAMP under the control of the controller 80. The correlated double sampling block 30 performs a correlated double sampling (CDS) with respect to each of the pixel signals output by the pixel array 10 and outputs pixel signals. The comparator block 40 compares each of the pixel signals from the correlated double sampling block 30 with the ramp signal RAMP from the ramp signal generator 90. The counting block 50 counts a clock CLK from the controller 80 according to each of the output signals of the comparator block 40. The memory block 60 stores count information from the counting block 50 under the control of the controller 80. The column readout circuit 70 sequentially outputs the data stored in the memory block 60 as pixel data PXDATA under the control of the controller 80. The controller 80 controls the operation of the row decoder 20, the ramp signal generator 90, the counting block 50, the memory block 60, and the column readout circuit 70.

The CDS performed by the correlated double sampling block 30 refers to a method for eliminating an undesired offset existing intrinsically in the pixel signal output by the COMS image sensor. According to the CDS, a level of a pixel signal before the incidence of the light is subtracted from the level of the pixel signal when the light is incident on the CMOS image sensor so as to allow a precise measurement of the pixel signal caused by the incident light.

Referring to FIG. 1, the correlated double sampling block 30 includes a plurality of correlated double samplers, the comparator block includes a plurality of comparators, the counting block 50 includes a plurality of counters, and the memory block 60 includes a plurality of memories. That is, one correlated double sampler, one comparator, one counter, and one memory may be provided for each of a plurality of columns.

A typical analog-to-digital converting operation performed by the correlated double sampler, the comparator, the counter, and the memory will now be described in reference to FIG. 2.

Figure 2:
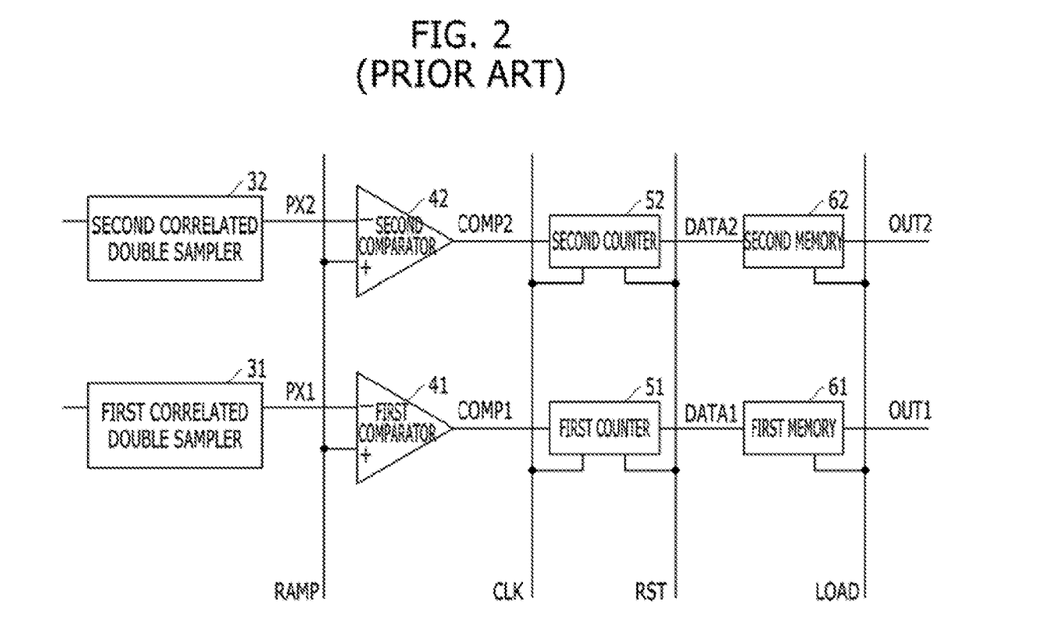
FIG. 2 is a partially detailed block diagram of the CMOS image sensor of FIG. 1 for two columns.

FIG. 2 shows a partially detailed block diagram of the CMOS image sensor of FIG. 1 for only two columns of the image sensor.

Referring to FIG. 2, a first correlated double sampler 31 performs the correlated double sampling with respect to the pixel signal from a first column of the pixel array 10 and outputs a first pixel signal PX1. A second correlated double sampler 32 performs the correlated double sampling with respect to the pixel signal from a second column of the pixel array 10 and outputs a second pixel signal PX2.

A first comparator 41 receives the first pixel signal PX1 through its first input terminal and the ramp signal RAMP from the ramp signal generator 90 through its second input terminal, compares the signals, and outputs a first comparison signal COMP1. A second comparator 42 receives the second pixel signal PX2 through its first input terminal and the ramp signal RAMP from the ramp signal generator 90 through its second input terminal, compares the signals, and outputs a second comparison signal COMP2.

The level of the ramp signal RAMP decreases periodically over time and, as a result, there is a time point that the two signals inputted to each of the comparators 41 and 42 have the same level during a period of the ramp signal RAMP. When this occurs, each of the comparison signals outputted by comparator will be inverted.

A first counter 51 counts the clock CLK output by the controller 80 from a time point when the ramp signal RAMP starts to decrease to a time point when the first comparison signal COMP1 transitions to a low state, and outputs first count information DATA1. A second counter 52 counts the clock CLK output by the controller 80 from the time point when the ramp signal RAMP starts to decrease to a time point when the second comparison signal COMP2 transitions to a low state, and outputs second count information DATA2. The first and second counters 51 and 52 may be initialized by a reset signal RST from the controller 80.

A first memory 61 stores the first count information DATA1 from the first counter 51 in response to a load signal LOAD from the controller 80, and outputs the first count information DATA1 to the column readout circuit 70. A second memory 62 stores the second count information DATA2 from the second counter 52 in response to the load signal LOAD, and outputs the second count information DATA2 to the column readout circuit 70.

As discussed above, the first comparator 41 compares the ramp signal RAMP with the first pixel signal PX1 from the first correlated double sampler 31, and transitions the first comparison signal COMP1 to the low state when the level of the ramp signal RAMP is lower than the level of the first pixel signal PX1. Also, the second comparator 42 compares the ramp signal RAMP with the second pixel signal PX2 from the second correlated double sampler 31, and transitions the second comparison signal COMP2 to the low state when the level of the ramp signal RAMP is lower than the level of the second pixel signal PX2. The first and second counters 51 and 52 count the clock CLK according to the first and second comparison signals COMP1 and COMP2, respectively. The output terminals of the first and second counters 51 and 52 are coupled to the first and second memories 61 and 62, which stores the outputs of the first and second counters 51 and 52, respectively, according to the load signal LOAD. The correlated double sampler, the comparator, the counter, and the memory provided for a column operate independently from those for another column. The outputs of the plurality of columns are sequentially output through the column readout circuit.

Figure 3:
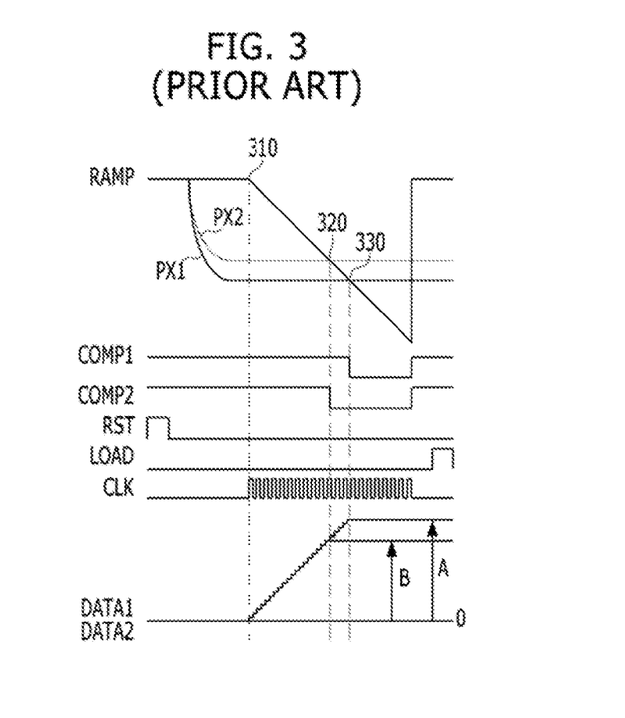
FIGS. 3 and 4 are timing charts illustrating the operation of the CMOS image sensor of FIG. 1.
Figure 4:
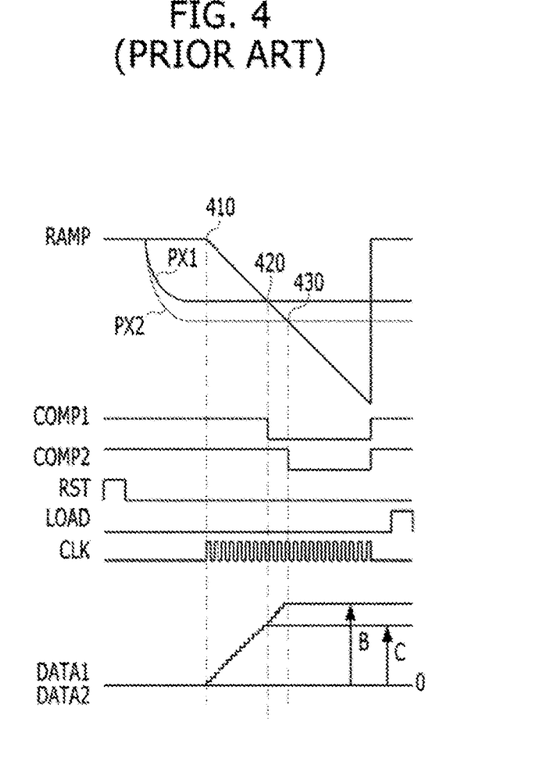

FIGS. 3 and 4 are timing charts illustrating the operation of the CMOS image sensor of FIG. 1, and show operation timings for the first and second pixel signals PX1 and PX2 output by the two correlated double samplers. Here, it is assumed that the second pixel signal PX2 shown in FIG. 3 has the same shape and magnitude as that shown in FIG. 4.

First, the first and second counters 51 and 52 are initialized by the reset signal RST from the controller 80. Also, the first and second comparators 41 and 42 output the first and second comparison signals COMP1 and COMP2 with a high state.

From a time point (310, 410) that the ramp signal RAMP changes, i.e., the ramp signal RAMP starts to decrease, the clock CLK is fed to the first and second counters 51 and 52 from the controller 80.

The first comparator 41 compares the ramp signal RAMP with the first pixel signal PX1, and transitions the first comparison signal COMP1 to the low state when the level of the ramp signal RAMP becomes lower than the level of the first pixel signal PX1 (330, 420). The second comparator 42 compares the ramp signal RAMP with the second pixel signal PX2, and transitions the second comparison signal COMP2 to the low state when the level of the ramp signal RAMP becomes lower than the level of the second pixel signal PX2 (320, 430).

The first counter 51 counts the clock CLK from the time point (310, 410) that the ramp signal RAMP starts to decrease to the time point (330, 420) that the first comparison signal COMP1 falls to the low state, and outputs the first count information DATA1. The second counter 52 counts the clock CLK from the time point (310, 410) that the ramp signal RAMP starts to decrease to the time point (320, 430) that the second comparison signal COMP2 falls to the low state, and outputs the second count information DATA2.

After the decrease of the ramp signal RAMP is completed, the first and second count information DATA1 and DATA2 from the first and second counters 51 and 52 are stored in the first and second memories 61 and 62 connected to the first and second counters 51 and 52, respectively, according to the load signal LOAD. In FIG. 3, the first count information DATA1 stored in the first memory 61 is 'A,' and the second count information DATA2 stored in the second memory 62 is 'B.' Meanwhile, in case of FIG. 4, the first count information DATA1 stored in the first memory 61 is 'C,' and the second count information DATA2 stored in the second memory 62 is 'B.'

The second count information DATA2 that is a digital code to which the pixel signal PX2 is analog-to-digital converted maintains a constant value even though the pixel signal PX1 of a neighboring pixel changes. In other words, the digital code output by an analog-to-digital converting circuit for a column is determined only by the pixel signal of the directly associated pixel and is irrelevant to the pixel signal of the neighboring pixel.

However, in the CMOS image sensor having a structure described above, the two counters 51 and 52 operate independently from each other. Also, the lower the intensities of the pixel signals are (i.e., the stronger the light incident on the pixels is), the larger the counted values of the counters 51 and 52 are. The increase in the counted values results in the increases in the number of toggles in the counters 51 and 52, which in turn increases the power consumption in the counters 51 and 52.

According to an embodiment of the present invention, the two counters do not operate independently from each other. Rather, one of the counters counts a common value of two pixel signals while the other counter counts a differential value of the two pixel signals so as to reduce the number of counts and the power consumption in the counters, which is described below with reference to FIGS. 5 through 10.

Figure 5:
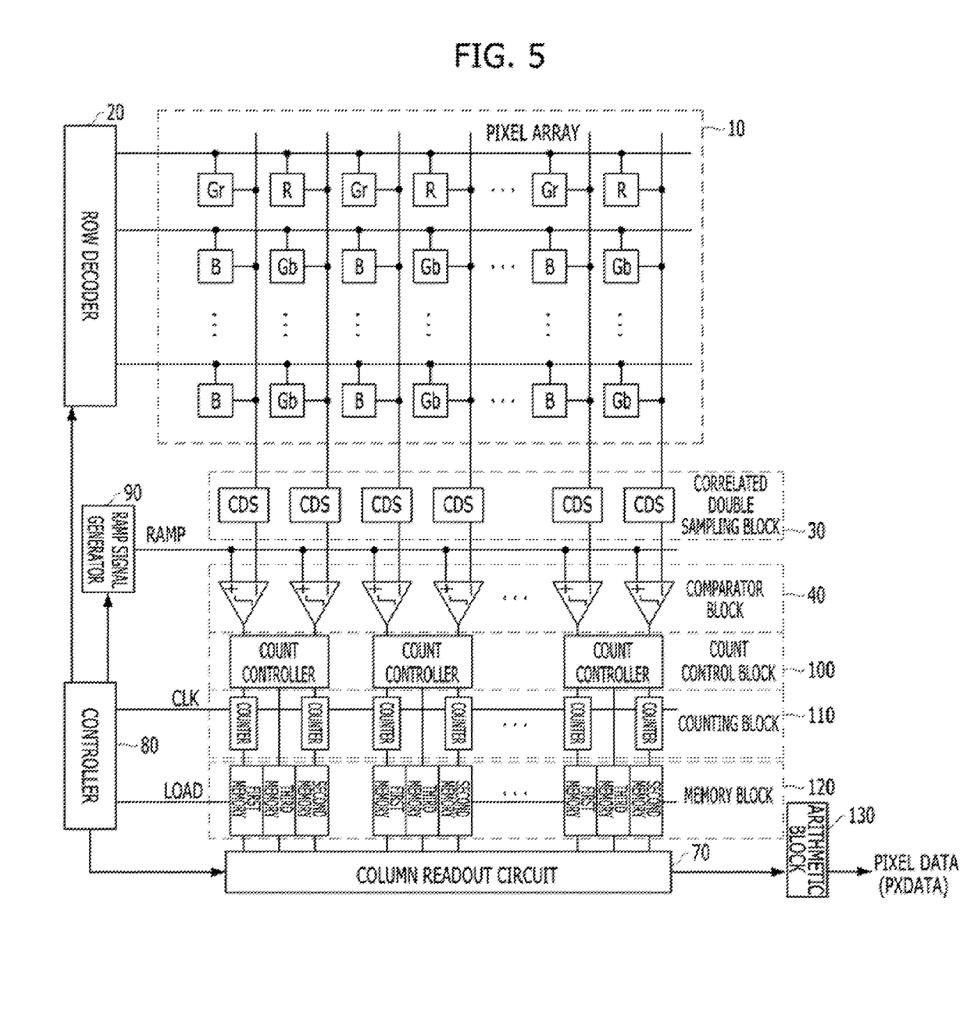
FIG. 5 is a block diagram of a CMOS image sensor, in accordance with an embodiment of the present invention.

Referring to FIG. 5 a CMOS image sensor is provided, in accordance with an embodiment of the present invention.

According to the embodiment of FIG. 5, the CMOS image sensor includes the pixel array 10, the row decoder 20, the correlated double sampling block 30, the comparator block 40, the column readout circuit 70, the controller 80, the ramp signal generator 90, a count control block 100, a counting block 110, a memory block 120, and an arithmetic block 130.

The pixel array 10 generates and outputs pixel signals corresponding to incident light. The row decoder 20 selects pixels in the pixel array 10 by a row line under the control of the controller 80 so as to allow controlling the operation of the pixels in the selected row line. The ramp signal generator 90 generates the ramp signal RAMP under the control of the controller 80. The correlated double sampling block 30 performs the correlated double sampling (CDS) with respect to each of the pixel signals output by the pixel array 10 and outputs pixel signals to the comparator block 40. The comparator block 40 compares each of the pixel signals received from the correlated double sampling block 30 with the ramp signal RAMP received from the ramp signal generator 90. The controller 80 controls the operation of the row decoder 20, the ramp signal generator 90, the count control block 100, the counting block 110, the memory block 120, and the column readout circuit 70.

The count control block 100 controls the counting block 110 to count a common value and a differential value between two pixel signals based on two neighboring output signals of the comparator block 40. The counting block 110 counts the clock CLK from the controller 80 during periods corresponding to the common value and the differential value between two pixel signals under the control of the count control block 100. The memory block 120 stores count information from the counting block 110 and operation information from the count control block 100 under the control of the controller 80. The column readout circuit 70 outputs the data stored in the memory block 120 under the control of the controller 80. The arithmetic block 130 performs arithmetic operations on the count information output by the column readout circuit 70 according to the operation information stored in the memory block 120 to generate and sequentially output pixel data PXDATA.

The correlated double sampling block 30 includes one correlated double sampler CDS for each column, the comparator block 40 includes one comparator for each column, the count control block 100 includes one count controller for every two adjacent columns, the counting block 110 includes one counter for each column, and the memory block 120 includes three memories, i.e., first, second and third memories for every two adjacent columns.

An exemplary analog-to-digital converting operation is performed as follows by the correlated double samplers, the comparators, the counting controller, the counters, and the memories.

Figure 6:
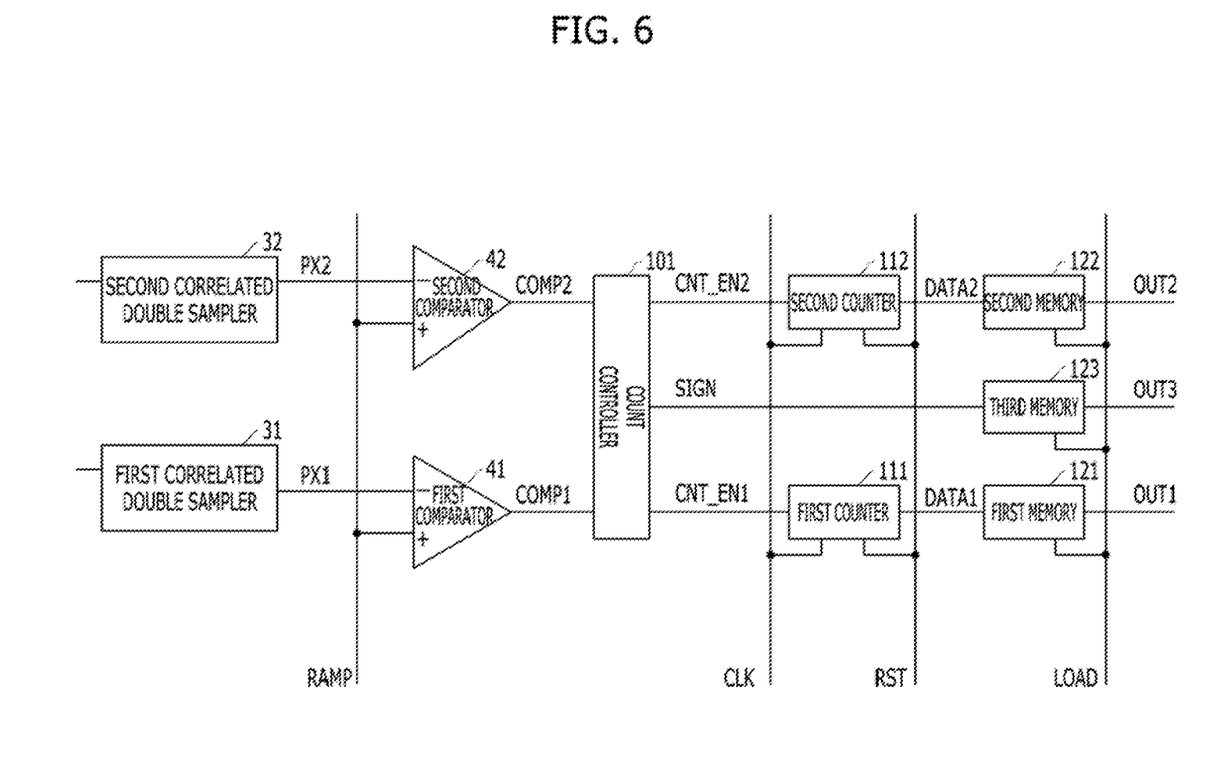
FIG. 6 is a partially detailed block diagram of the CMOS image sensor of FIG. 5 for two columns.

FIG. 6 is a partially detailed block diagram of the CMOS image sensor of FIG. 5 illustrating a counting apparatus suitable for counting levels of two pixel signals of two columns and performing an analog-to-digital conversion of the two pixel signals according to an embodiment of the present invention.

The configurations and operations of the first and second correlated double samplers 31 and 32 and the first and second comparators 41 and 42 shown in FIG. 6 may be the same as those shown in FIG. 2, and will not be described in detail for simplicity of description. The first and second comparison signals COMP1 and COMP2 output by the first and second comparators 41 and 42 are fed to a count controller 101 according to the present embodiment.

The count controller 101 generates first and second count control signals CNT_EN1 and CNT_EN2 that may be used for counting the common value and the differential value of the two pixel signals PX1 and PX2. Also, the count controller 101 generates operation information SIGN that indicates a method of an arithmetic operation to be performed with respect to the common value and the differential value to finally yield the pixel data PXDATA. The count controller 101 generates the first and second count control signals CNT_EN1 and CNT_EN2 and the operation information SIGN by performing an AND operation and an Exclusive-OR operation on the first and second comparison signals COMP1 and COMP2, and latching the comparison signals COMP1 and COMP2. The count controller 101 outputs the first and second count control signals CNT_EN1 and CNT_EN2 to first and second counters 111 and 112, and the operation information SIGN to a third memory 123. The generation of the first and second count control signals CNT_EN1 and CNT_EN2 and the operation information SIGN will be described in detail below with reference to FIGS. 7A and 7B.

The first and second counters 111 and 112 operate according to the first and second count control signals CNT_EN1 and CNT_EN2 respectively which are transmitted by the count controller 101 rather than the first and second comparison signals COMP1 and COMP2. The first counter 111 counts the clock CLK from a time point that the ramp signal RAMP starts to decrease to a time point that the first count control signal CNT_EN1 transitions to the low state, and outputs a count value as the first count information DATA1. The second counter 112 counts the clock CLK while the second count control signal CNT_EN2 from the count controller 101 remains at the high state, and outputs a count value as the second count information DATA2. The first and second counters 111 and 112 are initialized by the reset signal RST received from the controller 80.

A first memory 121 stores the first count information DATA1 from the first counter 111 in response to a load signal LOAD received from the controller 80 and outputs the stored count information DATA1 as an output information OUT1 to the column readout circuit 70. A second memory 122 stores the second count information DATA2 received from the second counter 112 in response to the load signal LOAD received from the controller 80 and outputs the stored count information DATA2 as an output information OUT2 to the column readout circuit 70. The third memory 123 stores the operation information SIGN received from the count controller 101 in response to the load signal LOAD received from the controller 80 and outputs the stored operation information SIGN to as an output information OUT3 the column readout circuit 70. For example, the third memory 123 may be implemented by a one-bit memory.

The first and second count information DATA1 and DATA2 and the operation information SIGN are sequentially output by the column readout circuit 70 to the arithmetic block 130.

The arithmetic block 130 performs an arithmetic operation on the first and second count information DATA1 and DATA2 according to the operation information SIGN and outputs the first and second pixel data PXDATA1 and PXDATA2. For example, assuming 1's complement or inverse of a binary number 'OUT3' is 'OUT3_b', the first pixel data PXDATA1 is calculated by an equation 'OUT1+OUT3_b*OUT2', and the second pixel data PXDATA2 is calculated by an equation 'OUT1+OUT3*OUT2'. Specifically, the first and second pixel data PXDATA1 and PXDATA2 may be calculated by equations 'DATA1+SIGN_b*DATA2' and 'DATA1+SIGN*DATA2', respectively.

Figure 7A:
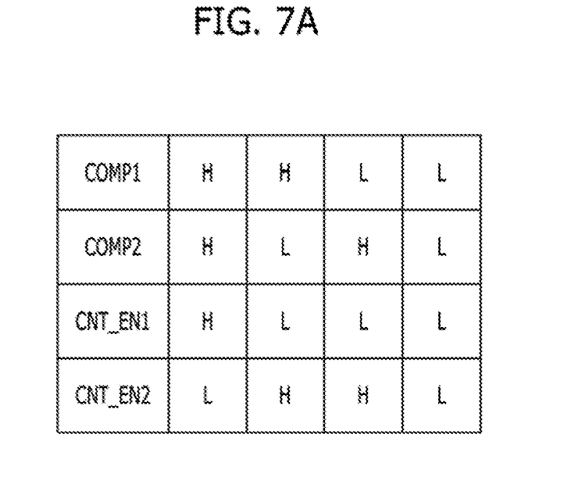
FIG. 7A is a truth table illustrating logical operations of a count controller, in accordance with an embodiment of the present invention.

FIG. 7A is a truth table illustrating logical operations of the count controller 101 in accordance with an embodiment of the present invention, and illustrates logic states of the first and second count control signals CNT_EN1 and CNT_EN2 for logic states of the first and second comparison signals COMP1 and COMP2.

As shown in FIG. 7A, the first count control signal CNT_EN1 is at the high state H when both the first and second comparison signals COMP1 and COMP2 are at the high state H, and is at the low state L when at least one of the first and second comparison signals COMP1 and COMP2 is at the low state L. The second count control signal CNT_EN2 is at the high state H when only one of the first and second comparison signals COMP1 and COMP2 is at the high state H, and is at the low state L when the logical state of the first comparison signal COMP1 is the same as that of the second comparison signal COMP2.

Meanwhile, the state of the operation information SIGN is determined when the first count control signal CNT_EN1 falls to the low state and the second count control signal CNT_EN2 rises to the high state. The operation information SIGN maintains a low state or is changed into the high state depending on which of the first and second comparison signals COMP1 and COMP2 transitions to the low state first. The operation information SIGN transitions to the high state when the first comparison signal COMP1 transitions to the low state earlier than the second comparison signal COMP2. The operation information SIGN maintains the low state when the second comparison signal COMP2 transitions to the low state earlier than the first comparison signal COMP1.

Figure 7B:
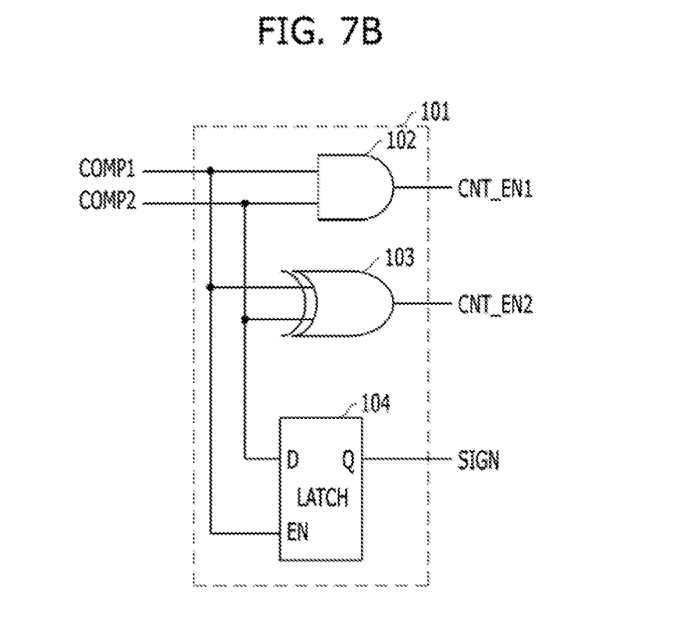
FIG. 7B is a circuit diagram of a count controller, in accordance with an embodiment of the present invention.

FIG. 7B is a circuit diagram of the count controller 101 of FIG. 6, in accordance with an embodiment of the present invention. The count controller 101 shown in FIG. 7B includes an AND gate 102, an Exclusive-OR gate 103, and a latch 104.

The AND gate 102 performs an AND operation on the first and second comparison signal COMP1 and COMP2 from the first and second comparator 41 and 42, respectively, to generate the first count control signal CNT_EN1 and output to the first counter 111, so that the first counter 111 counts the common value between two pixel signals. The Exclusive-OR gate 103 performs an Exclusive-OR operation on the first and second comparison signal COMP1 and COMP2 to generate the second count control signal CNT_EN2 and output to the second counter 112, so that that the second counter 112 may count the differential value between two pixel signals. The latch 104 determines the operation information SIGN according to a sequence of falling edges of the first and second comparison signal COMP1 and COMP2 to output the operation information SIGN to the third memory 123.

Figure 8:
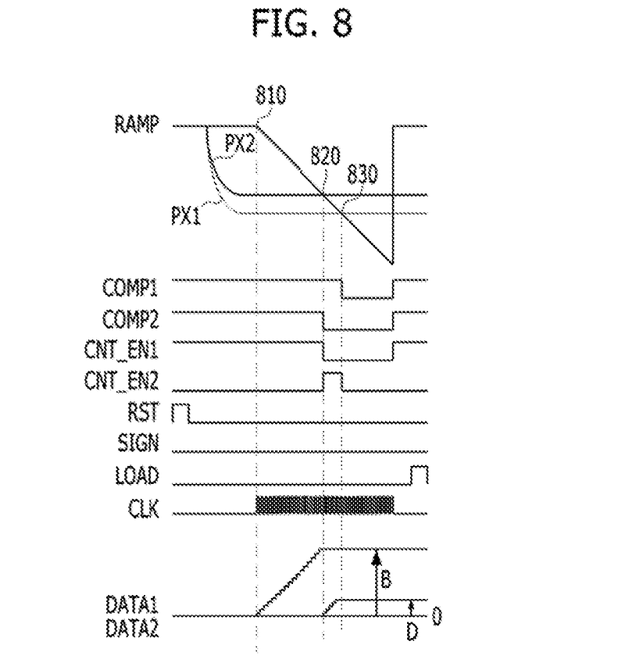
FIGS. 8 and 9 are timing charts illustrating the operation of the CMOS image sensor of FIG. 5.
Figure 9:
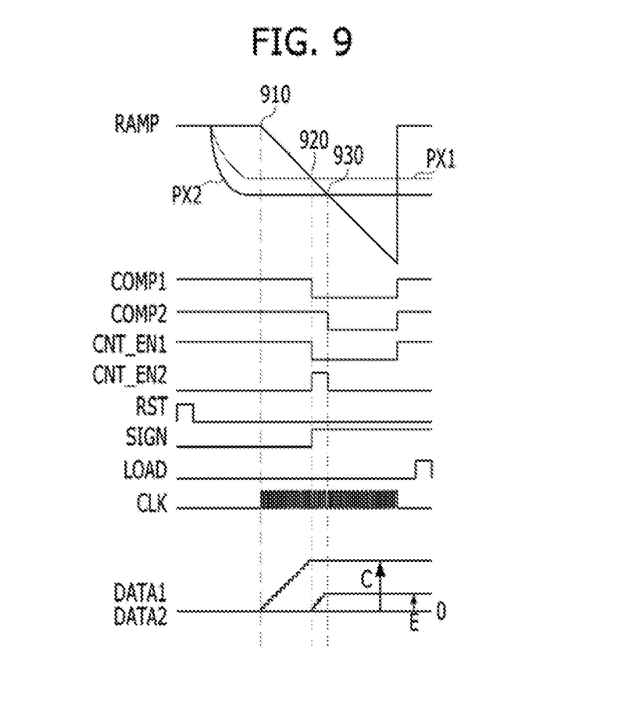

FIGS. 8 and 9 are timing charts illustrating the operation of the CMOS image sensor of FIG. 5, and show operation timings for the first and second pixel signals PX1 and PX2 transmitted by the two correlated double samplers. It is assumed that the first and second pixel signals PX1 and PX2 shown in FIG. 8 are the same as those shown in FIG. 3. Also, it is assumed that the first and second pixel signals PX1 and PX2 shown in FIG. 9 are the same as those shown in FIG. 4.

First, the first and second counters 111 and 112 are initialized by the reset signal RST received from the controller 80. The first and second comparators 41 and 42 are assumed to output the first and second comparison signals COMP1 and COMP2 with the high state.

From the time point that the ramp signal RAMP changes, i.e., the ramp signal RAMP starts to decrease, i.e., time points 810 and 910 as shown in FIGS. 8 and 9 respectively, the clock CLK is fed from the controller 80 to the first and second counters 111 and 112.

The first comparator 41 compares the ramp signal RAMP with the first pixel signal PX1, and transitions the first comparison signal COMP1 to the low state when the level of the ramp signal RAMP becomes lower than the level of the first pixel signal PX1 as indicated by time points 830 and 920 in FIGS. 8 and 9, respectively. The second comparator 42 compares the ramp signal RAMP with the second pixel signal PX2, and transitions the second comparison signal COMP2 to the low state when the level of the ramp signal RAMP becomes lower than the level of the second pixel signal PX2, i.e., at time points 820 and 930 of FIGS. 8 and 9, respectively.

The count controller 101 outputs the first count control signal CNT_EN1, which is at the high state when both the first and second comparison signals COMP1 and COMP2 are at the high state, or at the low state when at least one of the first and second comparison signals COMP1 and COMP2 is at the low state. Also, the count controller 101 outputs the second count control signal CNT_EN2, which is at the low state when the first and second comparison signals COMP1 and COMP2 are at the same state, or at the high state when the first and second comparison signals COMP1 and COMP2 are at different states. Further, the count controller 101 determines the operation information SIGN when the first count control signal CNT_EN1 falls to the low state and the second count control signal CNT_EN2 rises to the high state. The operation information SIGN transitions to the high state when the first comparison signal COMP1 falls to the low state earlier than the second comparison signal COMP2, but maintains the low state when the second comparison signal COMP2 falls to the low state earlier than the first comparison signal COMP1.

The first counter 111 generates the first count information DATA1 by counting the clock CLK from the time point 810, 910 of FIGS. 8 and 9, respectively, that the ramp signal RAMP starts to decrease to the time point 820, 920 of FIGS. 8 and 9, respectively, that the first count control signal CNT_EN1 falls to the low state. The second counter 112 generates the second count information DATA2 by counting the clock CLK during a period that the second count control signal CNT_EN2 maintains the high state, i.e., from the time point 820 to the time point 830 of FIG. 8 and from the time point 920 to the time point 930 of FIG. 9.

Referring to FIG. 8, the counting operation described above may be summarized as follows. First the clock CLK is fed to the first and second counters 111 and 112 on or before the time point (810) that the ramp signal RAMP starts to decrease. At the beginning of the decrease of the ramp signal RAMP, the first counter 111 counts the clock CLK since the first count control signal CNT_EN1 is at the high state, but the second counter 112 does not count the clock CLK since the second count control signal CNT_EN2 is at the low state. Since the level of the second pixel signal PX2 is higher than that of the first pixel signal PX1, the decreasing ramp signal RAMP crosses first the level of the second pixel signal PX2 of the two pixel signals PX1 and PX2. At this time, the second comparison signal COMP2 transitions to the low state. Accordingly, the first count control signal CNT_EN1 also transitions to the low state, and the first counter 111 stops counting of the clock CLK. Simultaneously, the second count control signal CNT_EN2 transitions from the low state to the high state, and the second counter 112 starts counting of the clock CLK according to the second count control signal CNT_EN2.

The operation information SIGN maintains the low state since the second comparison signal COMP2 falls to the low state earlier than the first comparison signal COMP1. Afterwards, when the decreasing ramp signal RAMP reaches the level of the first pixel signal PX1 (830), the first comparison signal COMP1 transitions to the low state. Accordingly, the second count control signal CNT_EN2 also transitions to the low state, and the second counter 112 stops counting of the clock CLK according to the second count control signal CNT_EN2.

After the decrease of the ramp signal RAMP is completed, the first and second count information DATA1 and DATA2 from the first and second counters 111 and 112 are stored in the first and second memories 121 and 122, respectively, in response to the load signal LOAD, and the operation information SIGN from the count controller 101 is stored in the third memory 123.

In FIG. 8, a reference character 'B' denotes the first count information DATA1 stored in stored in the first memory 121, which information corresponds to the common value between the pixel signals PX1 and PX2 discussed above. A reference character 'D' denotes the second count information DATA2 stored in stored in the second memory 122, which information corresponds to the differential value between the pixel signals PX1 and PX2 discussed above. At this time, the operation information SIGN stored in the third memory 123 has a value of zero. As a result, the first and second pixel data PXDATA1 and PXDATA2 output by the arithmetic block 130 is calculated as follows:

$$PXDATA1 = OUT1 + OUT3\_b * OUT2 \quad (1)$$
$$= B + 1 * D$$
$$= B + D$$

$$PXDATA2 = OUT1 + OUT3 * OUT2$$
$$= B + 0 * D$$
$$= B$$

Referring to FIG. 9, when the level of the first pixel signal PX1 is higher than that of the second pixel signal PX2, the decreasing ramp signal RAMP crosses first the level of the first pixel signal PX1 of the two pixel signals PX1 and PX2 (920). In such a case, the counting operation is similar to that depicted in FIG. 8. However, the operation information SIGN is transitioned to the high state when the first comparison signal COMP1 falls to the low state (920), and thus a value of one is stored in the third memory 123 as the operation information SIGN.

In FIG. 9, a reference character 'C' denotes the first count information DATA1 stored in stored in the first memory 121, which information corresponds to the common value between the pixel signals PX1 and PX2. A reference character 'E' denotes the second count information DATA2 stored in stored in the second memory 122, which information corresponds to the differential value between the pixel signals PX1 and PX2. At this time, the operation information SIGN stored in the third memory 123 has a value of one as mentioned above. As a result, the first and second pixel data PXDATA1 and PXDATA2 output by the arithmetic block 130 is calculated as follows:

$$PXDATA1 = OUT1 + OUT3\_b * OUT2 \quad (2)$$
$$= C + 0 * E$$
$$= C$$

$$PXDATA2 = OUT1 + OUT3 * OUT2$$
$$= C + 1 * E$$
$$= C + E$$

Even though the waveforms of the second pixel signal PX2 is the same between the two cases depicted in FIGS. 8 and 9, the second count information DATA2 in FIG. 9 is different from that in FIG. 8 due to the difference in the first pixel signal PX2 between the cases. However, since the duration of the second count control signal CNT_EN2 during which the second count information DATA2 is formed corresponds to the time gap between the falling edges of the first and second comparison signals COMP1 and COMP2, the quantity 'B+D' in the equation 1 equals to the quantity 'A' shown in FIG. 3, and the quantity 'C+E' in the equation 2 equals to the quantity 'B' shown in FIG. 4. Consequently, the first and second pixel data PXDATA1 and PXDATA2 will have the same values as the circuit of FIGS. 1 and 2.

On the other hand, the power consumption in the counting operation of a counter increases with an operational length, i.e., a number of counts, of the counter. Comparing FIG. 8 with FIG. 3, the number of counts in two counters according to FIG. 8 is 'B+D', whereas the number of counts according to FIG. 3 is 'A+B=2*B+D'. Thus, the power consumption in the two counters of the embodiment of FIG. 8 is reduced by a factor of 'B' corresponding to the number of fewer counts as compared to the conventional counter of FIG. 3. Comparing FIG. 9 with FIG. 4, the number of counts in two counters according to FIG. 9 is 'C+E,' whereas the number of counts according to FIG. 4 is 'C+B=2*C+E'. Thus, the power consumption in the two counters of the embodiment of FIG. 9 is reduced by a factor of 'C' corresponding to the number of fewer counts as compared to the conventional counter of FIG. 4.

In case that either of the first pixel signal PX1 or the second pixel signal PX2 is zero, the power consumption will be the same as that in the apparatus of FIG. 1. However, when the first pixel signal PX1 is the same as the second pixel signal PX2, the power consumption will be half of that of the conventional apparatus of FIG. 1, hence, the present invention apparatus offers substantial power consumption savings over the prior art.

Figure 10:
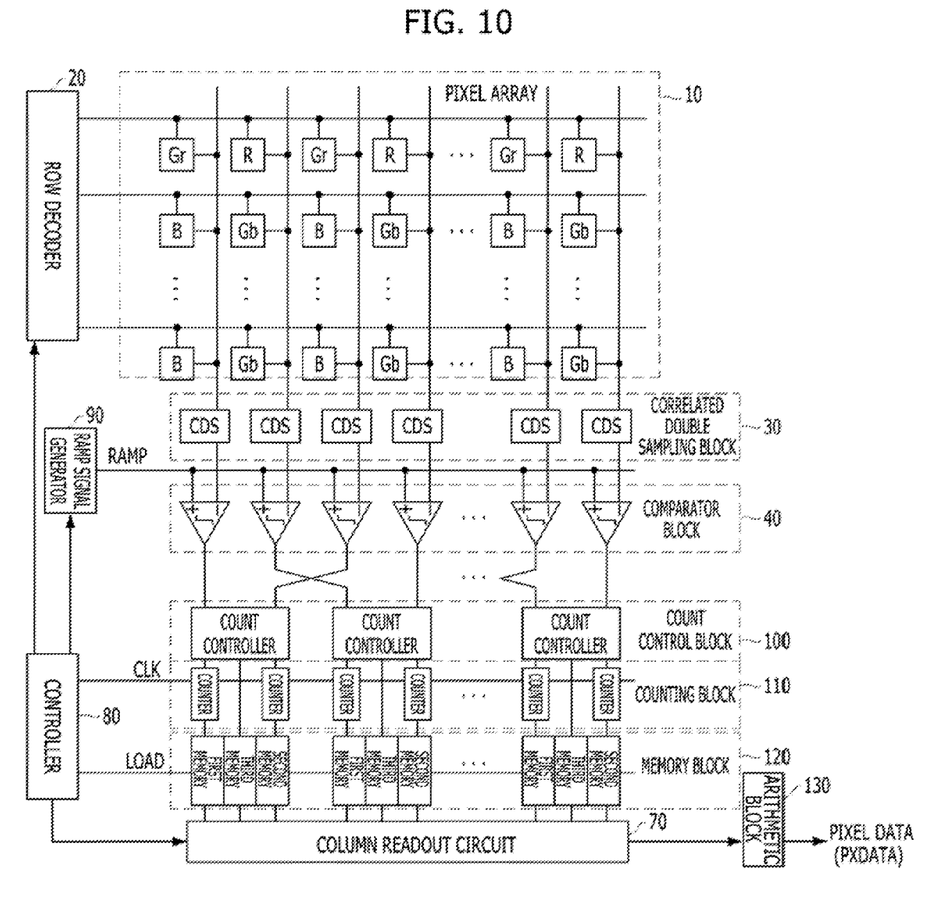
FIG. 10 is a block diagram of a CMOS image sensor, in accordance with another embodiment of the present invention.

FIG. 10 is a block diagram of a CMOS image sensor. According to another embodiment of the present invention.

In a Bayer pattern array which is currently the most commonly used color filter array in a CMOS image sensor, pixels of the same color are disposed at every other column. When an image is acquired by use of the CMOS image sensor, there is little difference in the amount of incident light between two cells of the same color. In view of this, the circuit of FIG. 5 is modified in another embodiment so that a count controller is connected to two comparators which process pixel signals of the same color. In such a case, the first and second pixel signals PX1 and PX2 are substantially the same and power consumption in the counter may be reduced significantly.

As shown in FIG. 10, a CMOS image sensor, according to another embodiment of the present invention, includes the pixel array 10, the row decoder 20, the correlated double sampling block 30, the comparator block 40, the column readout circuit 70, the controller 80, the ramp signal generator 90, the count control block 100, the counting block 110, the memory block 120, and the arithmetic block 130.

The pixel array 10 generates and outputs pixel signals corresponding to incident light. The row decoder 20 selects pixels in the pixel array 10 by a row line under the control of the controller 80 so as to allow controlling the operation of the pixels in the selected row line. The ramp signal generator 90 generates the ramp signal RAMP under the control of the controller 80. The correlated double sampling block 30 performs the correlated double sampling (CDS) with respect to each of the pixel signals output by the pixel array 10 and outputs pixel signals. The comparator block 40 compares each of the pixel signals from the correlated double sampling block 30 with the ramp signal RAMP from the ramp signal generator 90. The controller 80 controls the operation of the row decoder 20, the ramp signal generator 90, the count control block 100, the counting block 110, the memory block 120, and the column readout circuit 70.

The count control block 100 controls the counting block 110 to count the common value and the differential value between two pixel signals based on two output signals of the comparator block 40 corresponding to two neighboring columns of the same color. The counting block 110 counts the clock CLK from the controller 80 during periods corresponding to the common value and the differential value between two pixel signals under the control of the count control block 100. The memory block 120 stores count information received from the counting block 110 and operation information received from the count control block 100 under the control of the controller 80. The column readout circuit 70 outputs the data stored in the memory block 120 under the control of the controller 80. The arithmetic block 130 performs arithmetic operations on the count information received from the column readout circuit 70 according to the operation information stored in the memory block 120 to generate and sequentially transmit pixel data PXDATA.

For rearranging the output sequence of the pixel data PXDATA into a column order, an adjustment may be made, for example, in the interconnections between the column readout circuit 70 and the arithmetic block 130.

The configuration and operation of the circuit of FIG. 10 is similar to those of FIG. 5, in all other respects, and hence, detailed description thereof will be omitted.

Although various embodiments have been described for illustrative purposes, it will be apparent to those skilled in the art that various changes and modifications may be made without departing from the spirit and scope of the invention as defined in the following claims.

What is claimed is:

1. A counting apparatus comprising:
   a count control unit for controlling a counting operation of a common value and a differential value of two pixel signals according to two neighboring output signals of a comparator unit;
   a counting unit for counting a clock during a period corresponding to the common value and the differential value, according to control of the count control unit; and
   a memory unit for storing count information from the counting unit and operation information from the count control unit.

2. The counting apparatus of claim 1, wherein the count control unit comprises one count controller for every two columns,
   wherein the count controller comprises:
      an AND gate for performing an AND operation on the two neighboring output signals of the comparator unit to generate a first count control signal for use in counting of the common value of the two pixel signals;
      an Exclusive-OR gate for performing an Exclusive-OR operation on the two neighboring output signals of the comparator unit to generate a second count control signal for use in counting of the differential value of the two pixel signals; and
      a latch for determining and outputting the operation information according to falling sequences of the two neighboring output signals of the comparator unit.

3. The counting apparatus of claim 2, wherein a counting operation of the counting unit is determined by first and second count control signals from the count control unit.

4. The counting apparatus of claim 2, wherein the counting unit comprises two counters for every two columns including:
- a first counter for counting the clock from a time point that a ramp signal starts to decrease to a time point that the first count control signal is transitioned and outputting a first count information representing the common value; and
- a second counter for counting the clock during a period that the second count control signal maintains a high state and outputting a second count information representing the differential value.

5. The counting apparatus of claim 4, wherein the memory unit comprises three memories for every two columns including:
- a first memory for storing the first count information from the first counter according to a load signal;
- a second memory for storing the second count information from the second counter according to the load signal; and
- a third memory suitable for storing the operation information from the count controller according to the load signal.

6. The counting apparatus of claim 1, wherein the count control unit comprises one count controller for every two columns,
- wherein the count controller outputs a first count control signal having a low state when at least one of the two neighboring output signals of the comparator unit is at the low state,
- wherein the count controller outputs a second count control signal having a high state when the two neighboring correlated double sampling pixel signals unit are at logical states different from each other, and
- wherein the count controller determines the operation information at a time point that the first count control signal falls to the low state and the second count control signal rises to the high state, and maintains the operation information in the low state or transitions to the high state according to the falling sequences of the two neighboring output signals of the comparator unit.

7. An analog-to-digital converter, comprising:
- a correlated double sampling unit for performing a correlated double sampling with respect to each of pixel signals output by a pixel array to output correlated double sampling pixel signals;
- a comparator unit for comparing each of the correlated double sampling pixel signals with a ramp signal;
- a count control unit for controlling counting operation of a common value and a differential value of two pixel signals according to two neighboring correlated double sampling pixel signals;
- a counting unit for counting a clock during a period corresponding to the common value and the differential value, according to control of the count control unit; and
- a memory unit for storing count information from the counting unit and operation information from the count control unit.

8. The analog-to-digital converter of claim 7, wherein the count control unit comprises one count controller for every two columns,
- wherein the count controller outputs a first count control signal having a low state when at least one of the two neighboring correlated double sampling pixel signals is at the low state,
- wherein the count controller outputs a second count control signal having a high state when the two neighboring correlated double sampling pixel signals are at different logical states, and
- wherein the count controller determines the operation information at a time point that the first count control signal falls to the low state and the second count control signal rises to the high state, and maintains the operation information in the low state or transitions to the high state according to the falling sequences of the two neighboring correlated double sampling pixel signals.

* * * * *